United States Patent [19]

Sano et al.

[11] Patent Number: 5,273,919
[45] Date of Patent: Dec. 28, 1993

[54] METHOD OF PRODUCING A THIN FILM FIELD EFFECT TRANSISTOR

[75] Inventors: Masafumi Sano, Kawasaki; Katsuji Takasu, Asaka; Hisanori Tsuda, Atsugi; Yutaka Hirai, Tokyo, all of Japan

[73] Assignee: Canon Kabushiki Kaisha, Tokyo, Japan

[21] Appl. No.: 869,069

[22] Filed: Apr. 16, 1992

Related U.S. Application Data

[60] Continuation of Ser. No. 453,807, Dec. 20, 1989, abandoned, which is a division of Ser. No. 170,101, Mar. 11, 1988, Pat. No. 4,916,510, which is a continuation of Ser. No. 874,132, Jun. 13, 1986, abandoned.

[30] Foreign Application Priority Data

Jun. 20, 1985 [JP] Japan .................. 60-133004

[51] Int. Cl.$^5$ ..................... H01L 21/265
[52] U.S. Cl. ..................... 437/40; 437/101; 437/913; 148/DIG. 1; 148/DIG. 150; 148/DIG. 160
[58] Field of Search ........... 437/40, 101; 148/DIG. 50.160

[56] References Cited

U.S. PATENT DOCUMENTS

| | | | |
|---|---|---|---|
| 3,626,328 | 12/1971 | Esaki | 357/16 |
| 3,721,583 | 3/1973 | Blakeslee | |
| 4,407,710 | 10/1983 | Moustakas et al. | 437/101 |
| 4,459,739 | 7/1984 | Shepherd et al. | 357/23.7 |
| 4,465,706 | 8/1984 | Dalal et al. | 437/969 |
| 4,470,060 | 9/1984 | Yamazaki | 357/23.7 |
| 4,558,337 | 12/1985 | Saunier et al. | |
| 4,609,930 | 9/1986 | Yamazaki | 357/2 |
| 4,642,144 | 2/1987 | Tiedje et al. | 437/101 |

FOREIGN PATENT DOCUMENTS 0076169 4/1985 Japan .................. 357/23.7

OTHER PUBLICATIONS

Physics of Semi Devices; S. M. Sze; 1969 pp. 568–586.
The TFT-A new TFT, Weimer, 1962 pp. 1462–1469; Proceedings of the IRE.
Abeles et al., "Amorphous Semiconductor Superlattices", Physical Review Letters, Nov. 21, 1983, vol. 51, No. 21, pp. 2003–2006.

Primary Examiner—Brian E. Hearn
Assistant Examiner—Michael Trinh
Attorney, Agent, or Firm—Fitzpatrick, Cella, Harper & Scinto

[57] ABSTRACT

A method of producing a thin film field effect transistor. An insulating thin film layer is formed on a gate electrode subsequent to the gate electrode being formed on a substrate. A multilayer structure is formed on the insulating thin film layer subsequent to the insulating thin film layer being formed on the gate electrode by alternately laminating a number of non-monocrystalline semiconductor material layers and a number of non-monocrystalline material layers.

5 Claims, 1 Drawing Sheet

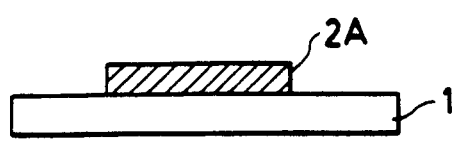
FIG. I(A)
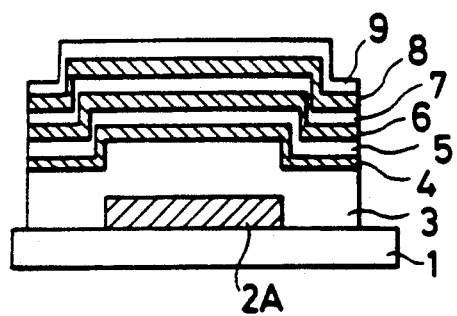
FIG. I(B)
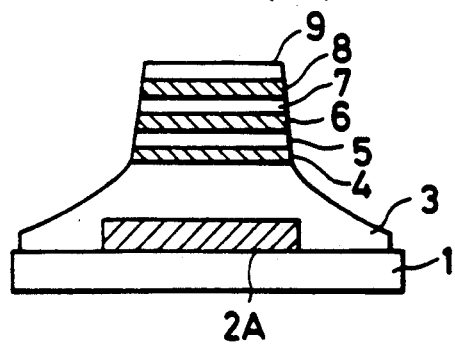
FIG. I(C)
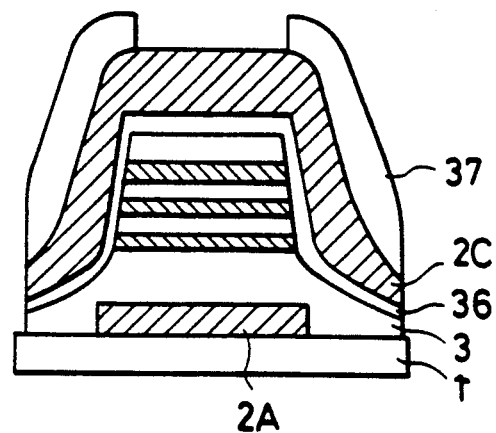
FIG. I(D)
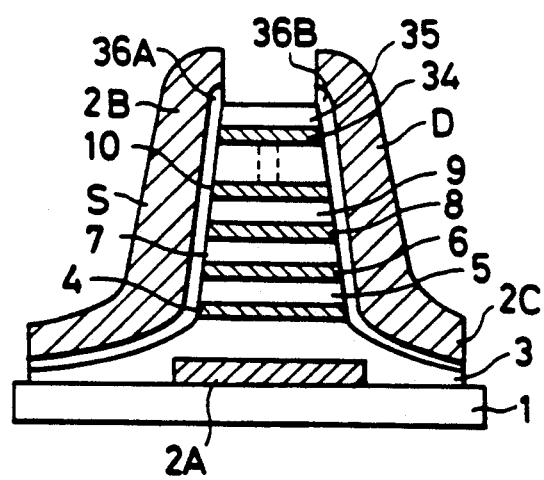
FIG. 2

METHOD OF PRODUCING A THIN FILM FIELD EFFECT TRANSISTOR

This application is a continuation of application Ser. No. 07/453,807 filed Dec. 20, 1989 now abandoned, which is a division application of 07/170,101 filed Mar. 11, 1988 and issued on Apr. 10, 1990 as U.S. Pat. No. 4,916,510 which is a continuation application of 874,132 filed Jun. 13, 1986 now abandoned.

BACKGROUND OF THE INVENTION

1. Field of the Invention

The present invention relates to a thin film transistor of a field effect type and, more particularly, to a field effect type thin film transistor which can also endure for the high-speed use.

2. Related Background Art

In recent years, the characteristics of a thin film transistor (TFT) have been improved with the aid of the remarkable advancement of the amorphous semiconductor technology.

Hitherto, there has been known that the thin film transistor is formed by a multilayer material consisting of a first solid layer of a semiconductor or insulating material formed of non-monocrystalline material and a second solid layer which are alternately laminated. This thin film transistor is mainly used in the high frequency resistor circuit network, RC circuit network, and the like.

However, such thin film type transistors don't have a low threshold voltage ($V_{th}$) nor a high field effect type mobility ($\mu_{FE}$). Therefore, thin type transistors are desired which have excellent specifications regarding &he threshold voltage and mobility which can be sufficiently used as a semiconductor material for a high speed device.

SUMMARY OF THE INVENTION

The present invention is made in consideration of the foregoing circumstances and it is an object of the present invention to provide a thin film transistor of the field effect type having a low threshold voltage and a large mobility.

BRIEF DESCRIPTION OF THE DRAWING

FIGS. 1A to 1D are diagrams for explaining the manufacturing processes according to an embodiment of a thin film transistor of the field effect type of the present invention; and FIG. 2 is a diagrammatical cross sectional view of the field effect type thin film transistor which is formed by those processes.

DETAILED DESCRIPTION OF PREFERRED EMBODIMENT

An embodiment of the present invention will be described in detail herein below with reference to the drawings. FIGS. 1A to 1D are diagrams for explaining the manufacturing processes according to an embodiment of a thin film transistor of the field effect type of the invention. FIG. 2 is a diagrammatical cross sectional view of the field effect type thin film transistor which is manufactured by those processes.

First, the main component elements will be described prior to describing the manufacturing processes.

In FIGS. 1A to 1D and 2, an electrode 2A is disposed on a substrate 1. The substrate 1 is made of an insulating material, e.g., glass plate or the like.

The electrode 2A is used as a gate (G) of this transistor. An insulating layer 3 is further formed on the electrode 2A. First solid layers 4, 6, 8, 10, . . . , 34 and second solid layers 5, 7, 9, . . . , 35 are alternately laminated like a multilayer structure on the insulating layer 3. n+ layers 36A and 36B are formed on both sides of those solid layers 4 to 35 so as to sandwich them. Electrodes 2B and 2C are provided so as to be come into ohmic contact with the n+ layers 36A and 36B. The electrode 2B serves as a source (S) of this transistor and the electrode 2C serves as a drain (D).

The n+ layers 36A and 36B have high impurity concentrations.

The manufacturing processes of the field effect type thin film transistor will be described herein below with reference to FIGS. 1A to 1D.

In these diagrams, reference numeral 1 denotes the substrate consisting of an insulating material and the electrode 2A is evaporation deposited on the substrate 1. Then, the gate electrode 2A is formed due to an etching. (Refer to FIG. 1A).

Next, the insulating layer 3 may be formed by way of, e.g., a photo CVD method in the following manner. The substrate 1 formed with the gate electrode 2A is disposed in the chamber of a light CVD apparatus and held at a substrate temperature of 250° C. Next, disilane gas of 2 SCCM and ammonia gas of 60 SCCM are simultaneously injected into the chamber while controlling their flow rates by a mass flow meter. A pressure is set to 0.9 Torr and the decomposition is performed by the light of a low pressure mercury lamp at an intensity of 30 mW/cm$^2$ thereby depositing an a-Si:N:H (hydroamorphous silicon nitride) film of a thickness of 1500Å. Then, the injection of the ammonia gas is stopped and only the disilane gas is injected into the chamber. In this case, flow rate of the disilane gas is set to 25 SCCM and a pressure is set to 0.9 Torr. The decomposition is executed by the light of a low pressure mercury lamp at an intensity of 30 mW/cm$^2$, thereby depositing an a-Si:H (hydroamorphous silicon) film of a thickness of 50Å. Subsequently, an a-Si:N:H film of a thickness of 100Å is again formed under the same conditions as above. Fifteen a-Si:H layers and fifteen a-Si:N:H layers, for example, are alternately repeatedly deposited. Refer to FIG. 1B (however, the case where respective three layers were repeatedly alternately formed is illustrated in this diagram).

As shown in FIG. 1C, what is called a mesa transistor is further formed using a resist mask smaller than the gate electrode 2A. The PH$_3$ gas and disilane of a volume ratio of 10-2 are again injected at a whole flow rate of 80 SCCM using a mass flow meter. In this case, a pressure is set to 0.9 Torr and a substrate temperature is set to 250° C. The decomposition is performed by a low pressure mercury lamp at intensity of 30 mW/cm$^2$ thereby forming an n+ layer of 750Å. Next, aluminum is evaporation deposited in the vacuum condition so as to have a thickness of 1000Å, thereby forming a multilayer structure as shown in FIG. 1D using a resist mask 37. The Al deposited layer and n+ layer are etched. In this manner, a transistor of a multilayer structure as shown in FIG. 2 is formed.

According to the field effect type thin film transistor manufactured as described above, multilayer materials are provided in the semiconductor channel portion.

Therefore, as compared with the conventional thin transistor, the threshold voltage can be reduced and at the same time, the mobility which causes a problem when electrons flow through the semiconductor channel portion can be also increased. Therefore, this transistor can be used for a high speed device such as a high speed spectral system or the like.

The operation of the embodiment will now be described.

In the embodiment, each difference of the optical energy band gap between the first solid layers 4, 6, 8, 10, ...,34 and the second solid layers 5, 7, 9, 11, ..., 35 is set to a value above 0.4 ev. Each thickness of the first solid layers 4, 6, 8, 10, ..., 34 is set to a value of 5 to 500Å. Each thickness of the second solid layers 5, 7, 9, 11, ..., 35 is set to a value of 50 to 1000Å.

The first and second solid layers are alternately laminated to form the multilayer materials consisting of a repetitive multilayer structure. The first solid layers 4, 6, 8, 10, ..., 34 serve as wells which can be quantum mechanically shut in. When the electrons are shut in these wells, the quantization is progressed in the vertical direction (direction of a Z axis) for the first solid layers 4, 6, 8, 10, ..., 34.

By increasing the thicknesses of the second solid layers 5, 7, 9, 11, ..., 35 as thick as possible, the electrons existing in the first solid layers 4, 6, 8, 10, ..., 34 are completely shut in these first solid layers. In this manner, by setting the thicknesses of the wells (the first solid layers) and of the barriers (the second solid layers) to proper values, the electrons existing in the substance move only in the vertical direction for the wells. Further, the thicknesses of the second solid layers 5, 7, 9, 11, ..., 35 are set to be so thin that the electrons at the quatization level can tunnel through the first solid layers 4, 6, 8, 10, ..., 34. Thus, the electrons freely move in the solid layers of the multilayer structure at the quantization level.

Therefore, by providing the multilayer structure which presents the quantization effect for the semiconductor channel portion, the field effect type thin film transistor having a low threshold voltage and a large mobility can be provided.

As a method of manufacturing field effect type transistors, the field effect type thin film transistor can be also produced by the following method. Namely, a-SiGe:H films each having a thickness of 50Å are formed as the first solid layers by use of the germane gas containing 10% of disilane. Then, as the second solid layers, a-Si:C:H (hydroamorphous silicon carbide) films each having a thickness of 100Å are formed by use of the disilane gas and methane gas.

It is sufficient to form one or more layers as the number of layers of each of the first and second solid layers. However, it is desirable to set the numbers of first and second solid layers to tens or more.

Although the light CVD method has been used as a method of manufacturing the first and second solid layers in the above embodiment, the invention is not limited to only this method. For example it is also possible to use glow discharge method, sputtering method, HOMO-CVD method, high vacuum evaporation depositing method, or the like.

As described above, the difference of the optical energy band gap between the first and second solid layers is set to above 0.4 eV. The thicknesses of the first and second solid layers are set to values such that the quantization effect is derived in the case of such a difference above 0.4 ev. These first and second solid layers are alternately laminated and such multilayer materials are repeatedly laminated to form a multilayer structure. These multilayer materials are provided for the semiconductor channel portion. Therefore, the mobility of electrons can be increased and at the same time the threshold voltage can be reduced. Thus, the thin film transistor manufactured by the method of the present invention can be used as a transistor for a high speed device such as a high speed spectral system or the like.

We claim:

1. A method of producing a thin film field effect transistor comprising the steps of:
    forming a gate electrode on a substrate;
    forming an insulating thin film layer on the gate electrode subsequent to formation of the gate electrode on the substrate;
    providing a mesa type laminating structure on the insulating thin film layer subsequently to formation of the insulating thin film layer on the gate electrode by alternately laminating a number of first solid layers each comprising an non-monocrystalline semiconductor material and a number of second solid layers each comprising a non-monocrystalline material, wherein a different of an optical energy band gap between the first and second solid layers is set to be greater than 0.4 eV, and a thickness of a single layer of each of the first and second layers has a value such that a quantum effect is obtained;
    forming a conductivity layer on the mesa type laminating structure;
    depositing a layers of electrode material on the conductivity layer; and
    removing a central portion of the layer of electrode material and the conductivity layer to form source and drain electrodes.

2. A method according to claim 1, wherein each of the first solid layers is made of a material selected from the group consisting of hydroamorphous silicone and hydroamorphous silicon germanium, and each of the second solid layers is made of a material selected from the group consisting of hydroamorphous silicon carbide and hydroamorphous silicon nitride.

3. A method according to claim 1, wherein a thickness of each of the first solid layers is 5 to 500Å.

4. A method according to claim 1, wherein a thickness of each of the second solid layers is 50 to 1000Å.

5. A method according to claim 1, wherein said solid layers are formed according to a photo CVD process.

* * * * *

UNITED STATES PATENT AND TRADEMARK OFFICE
CERTIFICATE OF CORRECTION

PATENT NO.   :  5,273,919
DATED        :  December 28, 1993
INVENTOR(S)  :  MASAFUMI SANO ET AL.

It is certified that error appears in the above-identified patent and that said Letters Patent is hereby corrected as shown below:

COLUMN 1

Line 35, "&he" should read --the--.

COLUMN 3

Line 13, "0.4 ev." should read --0.4 eV.--.

COLUMN 4

Line 9,  "0.4 ev." should read --0.4 eV.--.
    Line 27, "subsequently" should read --subsequent--.
    Line 30, "an" should read --a--.
    Line 33, "different" should read --difference--.
    Line 41, "layers" should read --layer--.
    Line 49, "silicone" should read --silicon--.

Signed and Sealed this

Nineteenth Day of July, 1994

Attest:

BRUCE LEHMAN

Attesting Officer    Commissioner of Patents and Trademarks